US007898090B1

(12) United States Patent
Eaton

(10) Patent No.: US 7,898,090 B1
(45) Date of Patent: Mar. 1, 2011

(54) GENERAL PURPOSE BALL GRID ARRAY SECURITY CAP

(75) Inventor: David D. Eaton, San Jose, CA (US)

(73) Assignee: IXYS CH GmbH (CH)

( * ) Notice: Subject to any disclaimer, the term of this patent is extended or adjusted under 35 U.S.C. 154(b) by 398 days.

(21) Appl. No.: 11/904,749

(22) Filed: Sep. 28, 2007

(51) Int. Cl.
  *H01L 23/48* (2006.01)
(52) U.S. Cl. ............... 257/777; 257/778; 438/127
(58) Field of Classification Search .......... 257/778, 257/777; 438/127
  See application file for complete search history.

(56) References Cited

U.S. PATENT DOCUMENTS

| 5,861,662 | A | 1/1999 | Candelore | 257/679 |
| 6,646,565 | B1 | 11/2003 | Fu et al. | 340/687 |
| 7,054,162 | B2 | 5/2006 | Benson et al. | 361/760 |
| 7,065,656 | B2 | 6/2006 | Schwenck et al. | 713/194 |
| 7,615,416 | B1 * | 11/2009 | Chock | 438/127 |
| 2001/0033012 | A1 | 10/2001 | Kommerling et al. | 257/679 |
| 2006/0086534 | A1 | 4/2006 | Oggioni et al. | 174/261 |
| 2006/0087883 | A1 | 4/2006 | Ozguz et al. | 365/185.04 |
| 2006/0170091 | A1 | 8/2006 | Karnezos | 257/686 |
| 2006/0231633 | A1 | 10/2006 | Farooq et al. | 235/492 |
| 2007/0018334 | A1 | 1/2007 | Peytavy et al. | 257/778 |
| 2007/0038865 | A1 | 2/2007 | Oggioni et al. | 713/178 |

OTHER PUBLICATIONS

Web pages from www.amkor.com, 18 pages (downloaded and printed out Apr. 30, 2007).

* cited by examiner

*Primary Examiner* — Thanh V Pham
*Assistant Examiner* — Caleb Henry
(74) *Attorney, Agent, or Firm* — Imperium Patent Works; Zheng Jim; T. Lester Wallace

(57) ABSTRACT

A general purpose BGA security cap includes a substrate, an integrated circuit die, and an array of bond balls. The substrate includes an anti-tamper security mesh of conductors. The bond balls include outer bond balls and inner bond balls that are fixed to the underside of the substrate. The integrated circuit drives and monitors the anti-tamper security mesh and communicates data using a serial physical interface through a subset of the inner bond balls. In one example, a user has circuitry to be protected. The user purchases the BGA security cap and fits it over the circuitry to be protected such that the integrated circuit of the security cap communicates tamper detect condition information via the serial interface to the underlying protected circuitry and causes sensitive information to be erased or a program to be halted in the event of a tamper condition.

21 Claims, 8 Drawing Sheets

GENERAL-PURPOSE BGA
SECURITY CAP

PACKAGE-ON-PACKAGE (POP)
SECURITY MODULE

ANTI-TAMPER MESH IN UPPER BGA SUBSTRATE
PREVENTS INTRUSION FROM ABOVE

ANTI-TAMPER PICKET FENCE PREVENTS
INTRUSION FROM THE SIDES

PACKAGE-ON-PACKAGE (POP)
SECURITY MODULE

GENERAL PURPOSE BALL GRID ARRAY SECURITY CAP

TECHNICAL FIELD

The described embodiments relate to securing electronic components and data, and more particularly, to a security cap that encloses electronic components and protects against unauthorized access to the electronic components.

BACKGROUND INFORMATION

It is often desired to protect sensitive data and software programs against unauthorized access and copying by thieves and hackers. Sensitive data can include passwords, account numbers, pin numbers, access codes, and other information that are used in financial transactions. Although data encryption/decryption methods are commonly used to secure sensitive data in financial transactions, thieves are learning the encryption methods and are sometimes able to break through the security. Furthermore, data and software can still be accessed prior to encryption. For example, a thief or hacker may still be able to physically penetrate electronic components and gain access to processors, various memory devices, and address/data busses that are used to communicate and process sensitive data.

To prevent sensitive data from being accessed in an unauthorized manner, various security modules and containers have been developed to enclose a circuit to be protected. A tamper detection circuit within the container is typically connected to the security layers to detect circuit tampering. Once a tamper condition has been detected, sensitive information stored in the circuit is quickly erased before it can be read by the possible attacker. Examples of such security modules are described in U.S. Patent Application Publication No. 2007/0018334, and in U.S. Patent Application Publication No. 2007/0038865.

However, the described methods for protecting electronic components have many limitations. Some involve complex or expensive technologies which are not conducive to mass production. Others provide inadequate protection. Alternative solutions are sought.

SUMMARY

A ball grid array (BGA) security cap includes a substrate member, an integrated circuit die, and an array of bond balls. The substrate member includes a first anti-tamper security mesh of conductors. The integrated circuit is wire-bonded to a first side of the substrate member. The bond balls include outer bond balls and inner bond balls. Both the outer bond balls and the inner bond balls are fixed to the first side of the substrate member. The integrated circuit die drives and monitors the first anti-tamper security mesh and communicates data (for example, tamper detect condition information) using a serial physical interface through a subset of the inner bond balls. In one example, the serial physical interface is a standard serial interface such as an SPI bus interface. The BGA security cap provides a flexible and low cost security solution and is usable to provide anti-tamper security to numerous different types of underlying circuits. If the circuit to be protected can communicate using the serial physical interface and can be covered by the BGA security cap, then the BGA security cap can generally be used to provide anti-tamper protection for the circuit. The integrated circuit of the BGA security cap and the circuit to be protected communicate through the serial physical interface.

In one example, the BGA security cap is piggy-back mounted to a BGA package portion to form a package-on-package (POP) secure module. The BGA package portion includes a substrate member, an integrated circuit die, an array of bond balls, and an array of lands. The integrated circuit die and the array of bond balls of the BGA package portion are fixed to the bottom surface of the substrate member. The bond balls of the BGA security cap are fixed to corresponding ones of the lands on the upper surface of the substrate member of the BGA package portion. The POP secure module is then surface mounted to a printed circuit board. The printed circuit board includes a second anti-tamper security mesh. The integrated circuit of the BGA security cap monitors both the first and the second meshes and detects various tamper conditions. When a tamper condition is detected, the integrated circuit of the BGA security cap quickly erases secure data it stores and informs the integrated circuit of the underlying BGA package portion that a tamper condition has been detected. The integrated circuit of the underlying BGA package portion responds by erasing sensitive information it stores and/or quit executing a running program. The two integrated circuits communicate with each other using a standard serial physical interface such as a SPI or JTAG interface. The standard serial physical interface is secure and is protected from tampering because the serial information is communicated between the integrated circuit of the BGA security cap and the integrated circuit of the BGA package portion through inner bond balls of the POP secure module.

In another example, the BGA security cap is a general purpose security cap and the integrated circuit of the BGA security cap is a specialized security IC designed for security purposes only. The security IC is inexpensive because it does not include circuitry other than that for the purpose of detecting tamper conditions and erasing sensitive data. The integrated circuit of the BGA package portion is an integrated circuit that does not have a security protection capability. The BGA security cap is manufactured by a first entity (for example, a first semiconductor company). The BGA security cap is then distributed by a second entity (for example, a distributor of integrated circuits) to be purchased by a third entity (for example, a user who builds the security cap into a system). Typically there are many such third entities, each using an identical BGA security cap to protect a different user-provided BGA package portion. A user purchases the BGA security cap, and then piggy-back mounts the BGA security cap to a user-provided BGA package portion to form a secure module. In one example, the BGA package portion includes a mass produced SDRAM and the overall secure module is used in a POS terminal or smart card device. If a tamper condition is detected, then the contents of the SDRAM are erased.

In another example, a BGA security cap and a user-provided BGA package portion are both surface mounted to a printed circuit board such that the BGA package portion is physically covered by the substrate member of the BGA security cap from the top, by outer bond balls of the BGA security cap from the side, and by the printed circuit board from the bottom. A first anti-tamper security mesh is embedded in the substrate member of the BGA security cap, and a second anti-tamper security mesh is embedded within the printed circuit board. The integrated circuit die of the BGA security cap is a specialized security IC, and the integrated circuit die of the BGA package portion is a general-purpose mass produced IC. If the security IC detects a tamper condition, then the security IC informs the general-purpose IC through a dedicated tamper detection line. The general purpose IC responds by erasing sensitive information stored in the general purpose IC. The security IC can also communicate with the general-purpose IC using a serial physical interface such as a SPI or a JTAG interface. In one example, the BGA security cap is manufactured by a first entity (for example, a first semiconductor company). The BGA security cap is then distributed by a second entity (for example, a distributor of integrated circuits) to be purchased by a third entity (for example, a user who builds the BGA security cap into a system). Typically there are many such third entities, each using an identical BGA security cap to protect a different user-provided BGA package portion. Rather than just protecting a user-provided BGA package portion, the BGA security cap can also enclose other user circuitry that is to be protected from tampering.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
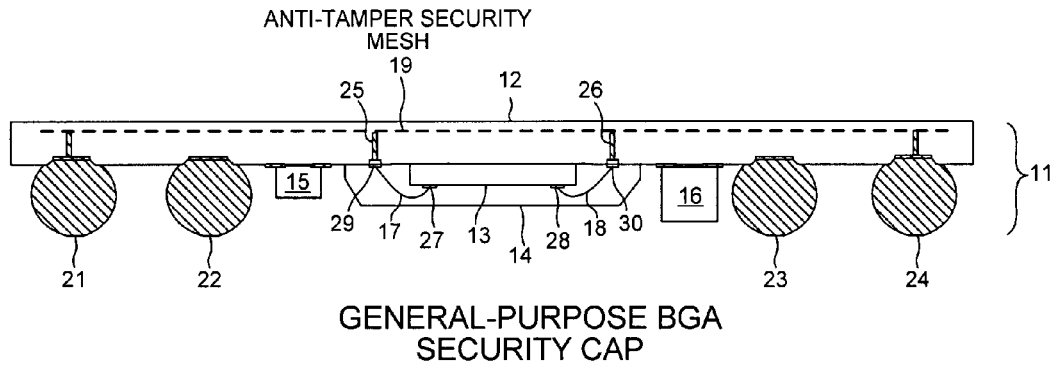
FIG. 1 is a simplified cross-sectional view of a ball grid array (BGA) security cap 11 in accordance with a novel aspect.

FIG. 1 is a simplified cross-sectional view of a general-purpose Ball Grid Array (BGA) security cap 11 in accordance with a novel aspect. BGA security cap 11 includes a substrate member 12, an integrated circuit die 13, an array of bond balls, and discrete components 15 and 16. Integrated circuit die 13 is connected by wire bonds to a lower surface of substrate member 12 and is encapsulated with a block of encapsulant 14. Two of the bond wires 17 and 18, and four of the bond balls 21-24 are illustrated in the cross-sectional view. Bond balls 21 and 24 are outer bond balls, and bond balls 22 and 23 are inner bond balls. All bond balls are disposed to the lower surface of substrate member 12.

Figure 6:
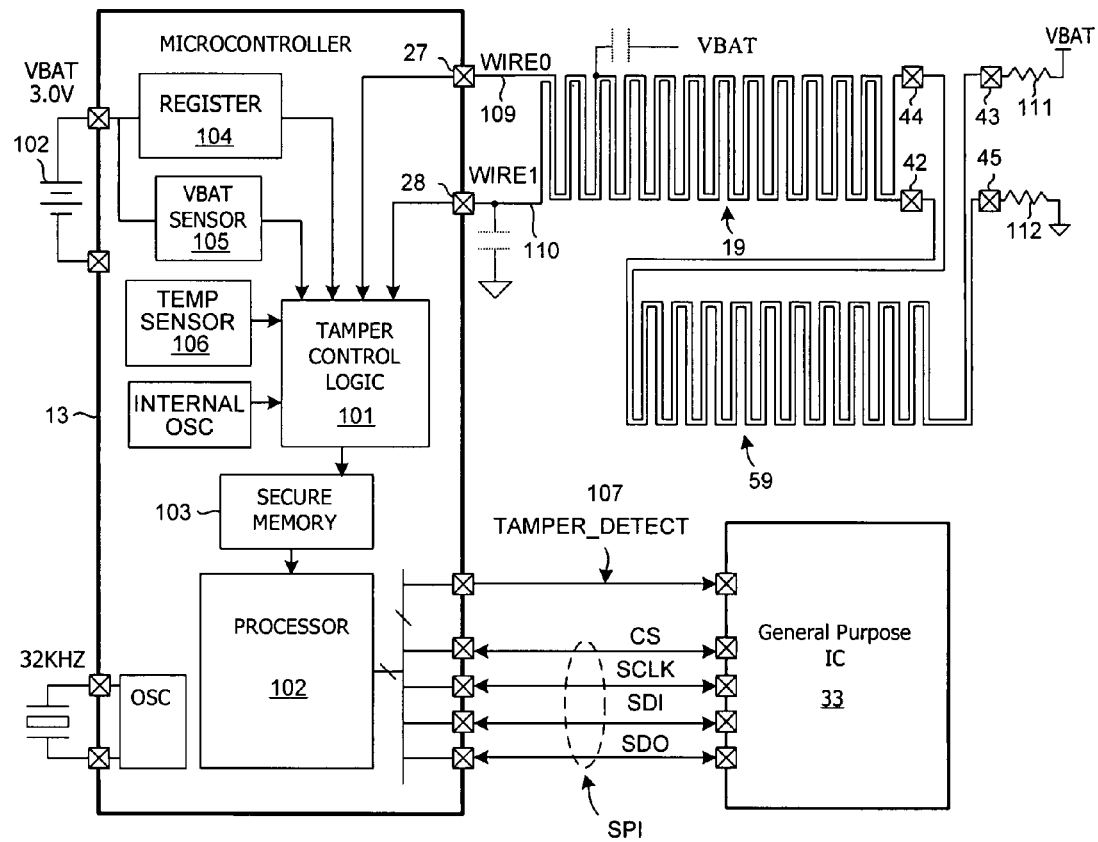
FIG. 6 is a simplified circuit diagram that illustrates how integrated circuit 13 drives and monitors a security mesh and communicates to another integrated circuit through a serial physical interface.

In the illustrated example, substrate member 12 is a multiple layer printed circuit board of the type customarily used in the manufacture of BGA packages. Substrate member 12 includes a first anti-tamper security mesh 19 of conductors. The conductors of mesh 19 are approximately 0.2 millimeters wide and are spaced at approximately 0.2 millimeters from one another. As described in further detail below, the mesh is powered and monitored by tamper control logic (see reference numeral 101 in FIG. 6) on integrated circuit die 13 of FIG. 6. The tamper control logic on integrated circuit die 13 of FIG. 6 is connected to conductors in mesh 19 of FIG. 6. As illustrated in FIG. 1, the tamper control logic is coupled to a first conductor (WIRE0) of mesh 19 via a first terminal 27, bond wire 17, bond pad 29, and conductive via 25. The tamper control logic is also coupled to a second conductor (WIRE1) of mesh 19 via a second terminal 28, bond wire 18, bond pad 30, and conductive via 26.

Figure 2:
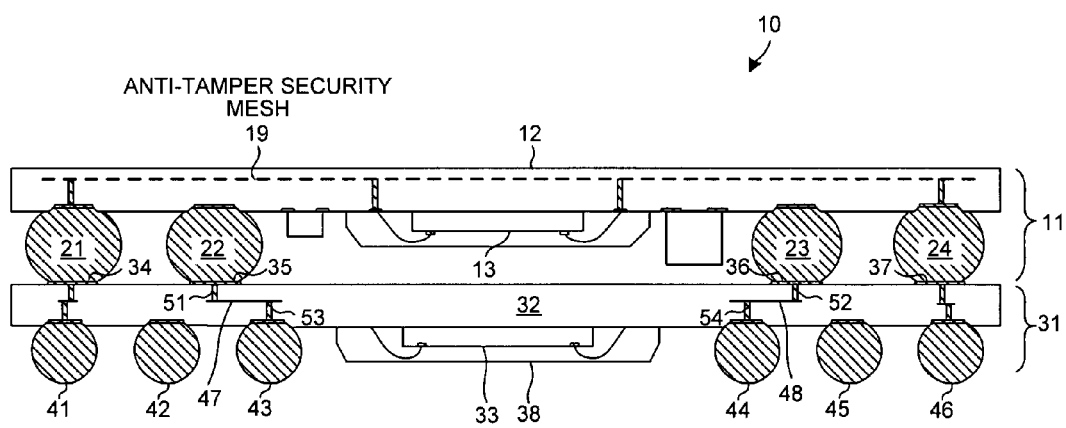
FIG. 2 is a simplified cross-sectional view of a package-on-package (POP) secure module 10 that includes BGA security cap 11 of FIG. 1.

FIG. 2 is a simplified cross-sectional view of a Package-on-Package (POP) secure module 10 that includes BGA security cap 11 of FIG. 1. POP secure module 10 includes BGA security cap 11 and a BGA package portion 31. BGA package portion 31 includes a substrate member 32, an integrated circuit die 33, an array of lands, and an array of bond balls. Four of the lands 34-37 and six of the bond balls 41-46 are illustrated in the cross-sectional view. Integrated circuit die 33 is connected by wire bonds to a lower surface of substrate member 32 and is encapsulated with block of encapsulant 38. Bond balls 21-24 of BGA security cap 11 register with and are fixed to corresponding ones of the lands 34-37 on an upper surface of substrate member 32 of BGA package portion 31. BGA security cap 11 is therefore piggy-back mounted to BGA package portion 31 so that BGA security cap 11 and BGA package portion 31 together form POP secure module 10.

Figure 3:
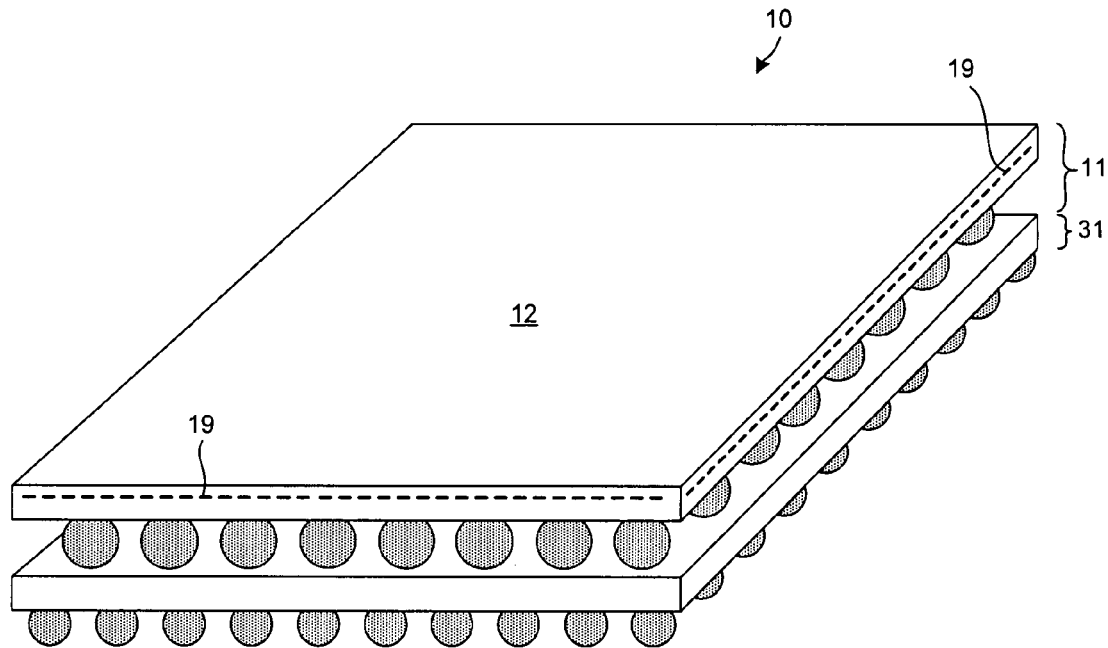
FIG. 3 is a perspective view of the POP secure module 10 of FIG. 2.

FIG. 3 is a perspective view of POP secure module 10 of FIG. 2. The dashed lines labeled with numeral 19 are not visible from the outside of module 10, but rather illustrate the plane in which mesh 19 is disposed within substrate member 12.

Figure 4:
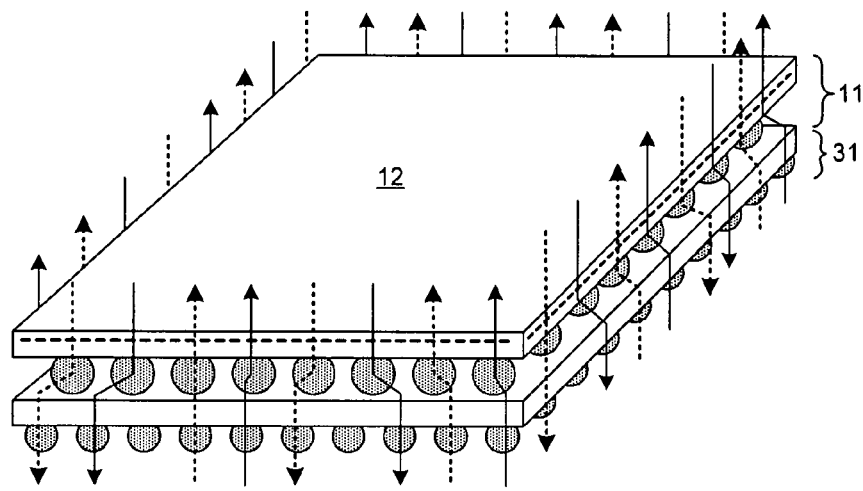
FIG. 4 is a perspective view that illustrates the picket fence extension of a first anti-tamper security mesh of BGA security cap 11.

FIG. 4 is a perspective view that illustrates the picket fence extension of anti-tamper security mesh 19. Mesh 19 is made to cup down around the side edges of POP secure module 10. In one example, the two conductors of mesh 19 are made to meander vertically up and down through the bond balls of BGA security cap 11 and BGA package portion 31 so as to form a picket fence like security structure that surrounds the integrated circuit 13 and 33. The picket fence like security structure helps protect against probing of POP secure module 10 from the side. For additional details on picket fence like security structure, see: U.S. patent application Ser. No. 11/786,871 entitled "Package-on-Package Secure Module Having Anti-Tamper Mesh In the substrate of the Upper Package", filed Apr. 13, 2007, by Steven M. Pope et al. (the subject matter of which is incorporated herein by reference). In another example, in order to reduce the overall cost of security module 10, mesh 19 exists in a lateral extending plane within substrate member 12 without forming the picket fence-like security structure.

Figure 5:
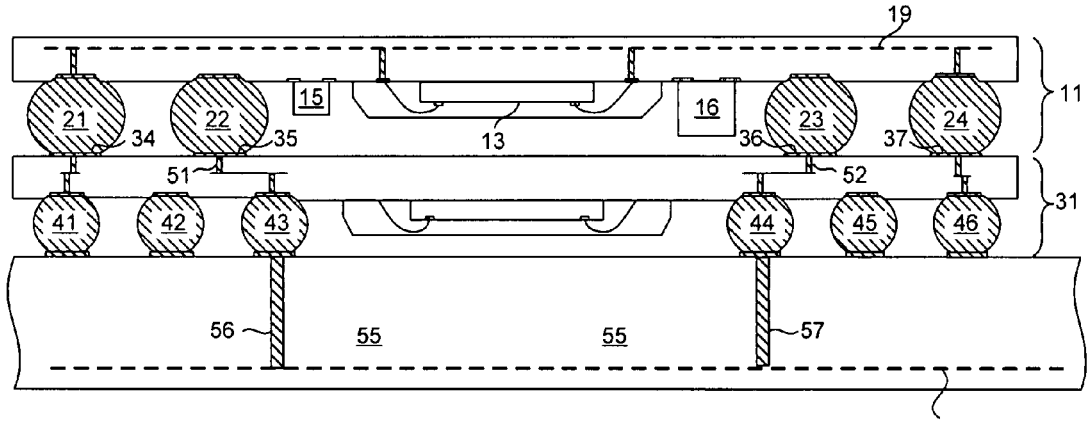
FIG. 5 is a simplified cross-sectional view of POP secure module 10 that is disposed on a printed circuit board.

FIG. 5 is a simplified cross-sectional diagram of POP secure module 10 that is surface mounted to a printed circuit board 55. A second anti-tamper security mesh 59 is disposed in a metal trace layer within printed circuit board 55. As illustrated in FIG. 5, bond ball 43 is coupled to a first terminal of second anti-tamper security mesh 59 via conductive via 56, and bond ball 44 is coupled to a second terminal of second anti-tamper security mesh 59 via conductive via 57.

FIG. 6 is a simplified circuit diagram that illustrates how integrated circuit die 13 drives and monitors first mesh 19 and second mesh 59. As illustrated in FIG. 6, integrated circuit 13 is a microcontroller-based integrated circuit that includes tamper control logic 101, a processor 102, a secure memory 103, a register 104, a power (voltage) VBAT sensor 105, a temperature TEMP sensor 106 and other specific circuitry. First terminal 27 and second terminal 28 are the terminals illustrated in FIG. 1 that are coupled to first and second conductors 109 and 110 of the first anti-tamper security mesh 19, respectively. Although mesh 19 is illustrated in FIG. 6 as having a regular serpentine path, the actual paths of conductors 109 and 110 of mesh 19 extend across the plane illustrated with the dashed line in FIG. 1 as well through the picket fence structure illustrated in FIG. 4. Each conductor of mesh 19 is terminated with a termination resistor. First conductor 109 (WIRE0) is terminated by resistor 111 whereas second conductor 110 (WIRE1) is terminated by resistor 112. Termination resistors 111 and 112 are discrete components and are mounted to surface mount pads on the lower surface of substrate member 12. Discrete component 15 of FIG. 1 is resistor 111. Resistor 112 is not seen in the particular cross-section of FIG. 1.

In the example of FIG. 6, first mesh 19 extends laterally through the substrate member of BGA security cap 11 and second mesh 59 extends laterally though printed circuit board 55. Mesh 19 and 59 are, however, driven and monitored from only two terminals of integrated circuit 13. As illustrated in FIG. 6, conductor 109 of first mesh 19 extends from terminal 27, laterally through the substrate member 12 of BGA security cap 11, and eventually extends down to bond ball 44 of BGA package portion 31. From bond ball 44, the conductor extends laterally through the mesh layer of the printed circuit board 55 as a part of second mesh 59, and then extends back up to bond ball 43 of BGA package portion 31. Bond ball 43 is connected through BGA security cap 11 to discrete resistor 111. The second conductor 110 is connected in a similar fashion. Therefore, the first mesh 19 and the second mesh 59 actually form a single larger anti-tamper mesh structure that extends both over and underneath integrated circuits 13 and 33 within secure module 10. If secure module 10 is to be used in a configuration without second mesh 59, then bond ball 44 can be coupled directly to bond ball 43 by a short trace on printed circuit board 55 or alternatively by a connection on secure module 10.

As illustrated in FIG. 6, tamper control logic 101 interfaces with various tamper detection mechanisms, such as power tamper detection from VBAT sensor 105, temperature tamper detection from TEMP sensor 106, and mesh tamper detection from WIRE0 and WIRE 1. For instance, if WIRE0 is cut or is shorted with WIRE1 during an attempt of physical intrusion, then a TAMPER_DETECT signal will be asserted. Once a tamper condition has been detected, integrated circuit 13 of BGA security cap 11 quickly erases secure data stored in secure memory 103. In addition, tamper control logic 101 informs processor 102, which sends out the TAMPER_DETECT signal to integrated circuit 33 of BGA package portion 31 through a dedicated tamper detection line 107. In one example, sensitive information is stored within integrated circuit 33. When integrated circuit 13 of BGA security cap 11 informs integrated circuit 33 of BGA package portion 31 that a tamper condition has been detected, integrated circuit 33 responds by quickly erasing sensitive information it stores. Erasing of the integrated circuit 33 of BGA package portion 31 can be effectuated by executing a program within integrated circuit 33 of BGA package portion 31. Upon detection of a tamper condition, the program causes sending of address information and data sufficient to overwrite or erase data within integrated circuit 33 of BGA package portion 31. In another embodiment, the TAMPER_DETECT signal may cause an interrupt on integrated circuit 33, and integrated circuit 33 may respond by terminating or halting a program that is running within integrated circuit 33 of BGA package portion 31.

In addition to the dedicated tamper detection line 107, integrated circuit 13 also communicates with integrated circuit 33 using a serial physical interface (for instance, a standard SPI bus interface as illustrated in FIG. 6). Serial Peripheral Interface (SPI) is a standard interface commonly used for a synchronous serial communication between host processor and peripherals or between two processors. As illustrated in FIG. 6, SPI requires two control lines (CS and SCLK) and two data lines (SDI and SDO) for the serial communication. In one example, register 104 of integrated circuit 13 stores configuration information that is used to configure the mode of operation of tamper control logic 101. Typically, tamper control logic 101 operates in an automatic mode with default threshold values that trigger a tamper condition. For instance, a TAMPER_DETECT signal will be asserted if the supply voltage detected by VBAT sensor is below a certain default threshold voltage in anticipating a power tampering event. However, it is possible that integrated circuit 33 uses a different supply voltage. If integrated circuit 33 uses a different supply voltage, then integrated circuit 33 is able to configure the threshold voltage across the SPI interface. In another example, register 104 of integrated circuit 13 stores a tamper log that provides tamper detection results such as temperature, voltage, or mesh interference. Integrated circuit 33 may read the tamper log across the SPI interface.

Figure 7:
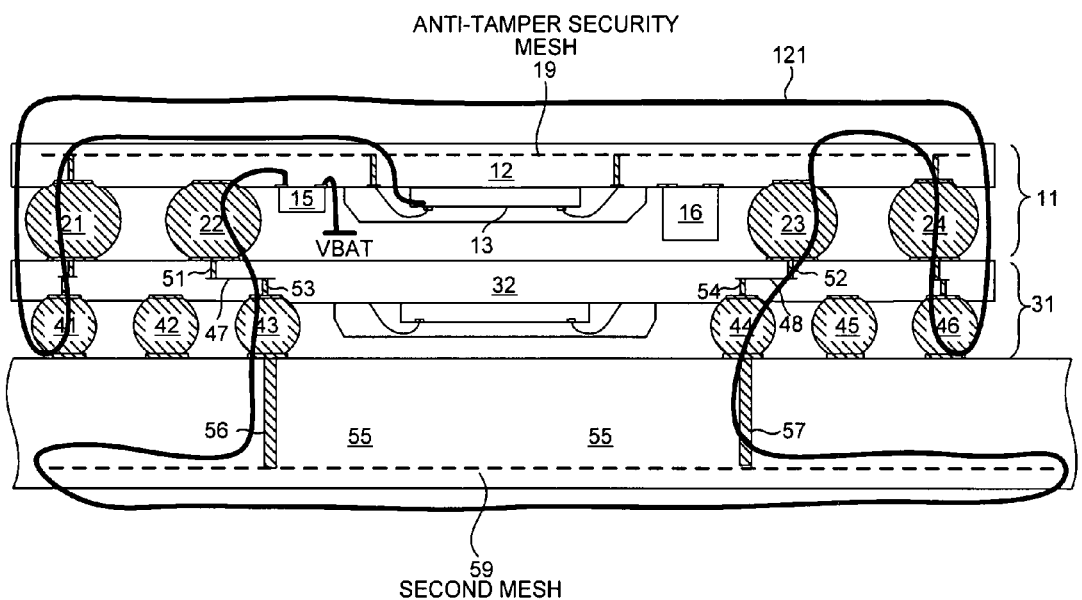
FIG. 7 is a simplified cross-sectional view that illustrates the use of a resistor to terminate an anti-tamper security mesh.

FIG. 7 is a cross-sectional view that illustrates the use of resistor 111 to terminate the anti-tamper security mesh. Terminal 27 of integrated circuit 13 is coupled to a first terminal of resistor 111 by a conductive path. The conductive path is illustrated by heavy line 121. The conductive path extends from integrated circuit 13 up to the first mesh 19 through first terminal 27, bond wire 17, bond pad 29, conductive via 25, and laterally through the substrate member 12 of BGA security cap 11. The conductive path then extends down and up through pickets of a picket fence mesh structure (see prior description in association with FIG. 4), then from left to right across BGA security cap 11, then extends down and then up through other pickets, and then down through inner bond ball 23, conductive via 52, laterally conductive layer 48, conductive via 54, and to bond ball 44. As described in the previous paragraph, bond ball 44 is coupled to bond ball 43 through the second mesh 59 within the printed circuit board 55. The conductive path further extends to the first terminal of resistor 111 through conductive via 53, laterally conductive layer 47, conductive via 51, and inner bond ball 22. The supply voltage VBAT is present on a second terminal of resistor 111.

Figure 8:
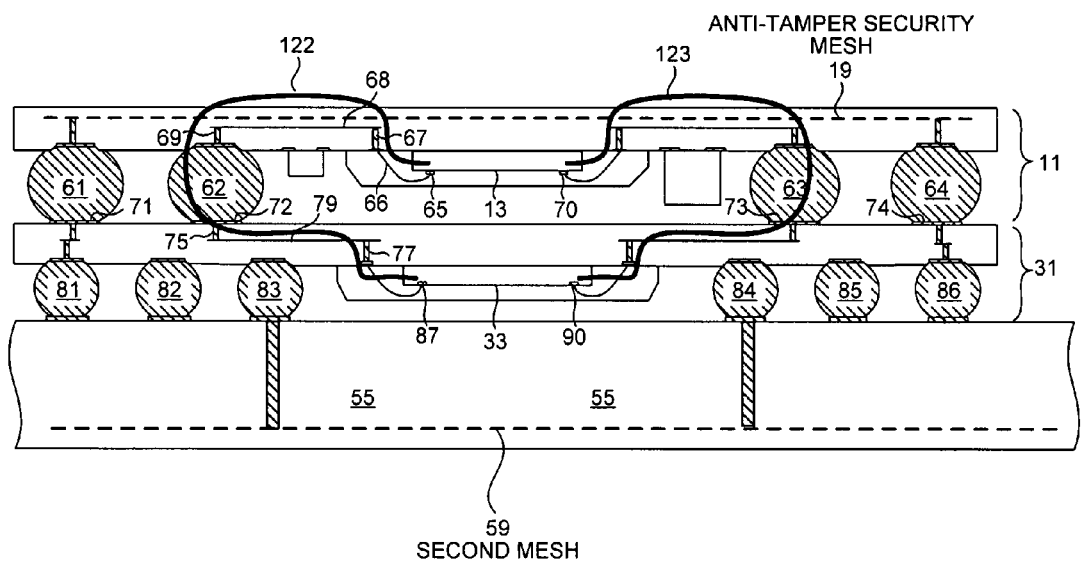
FIG. 8 is a simplified cross-sectional view that illustrates a conductive path for the serial physical interface of FIG. 6.

FIG. 8 is a cross-sectional view that illustrates how integrated circuit 13 is physically connected to integrated circuit 33 and communicates using a serial physical interface. Four bond balls 61-64 of BGA security cap 11, four lands 71-74 of BGA package portion 31, and six bond balls 81-86 of BGA package portion 31 are illustrated in the cross-sectional view. The bond balls 61-64 are fixed to the corresponding ones of the lands 71-74. As illustrated in FIG. 8, terminal 65 of integrated circuit 13 is coupled to terminal 87 of integrated circuit 33 through a conductive path. The conductive path is illustrated by heavy line 122. The conductive path extends from terminal 65 to inner bond ball 62 through bond wire 66, conductive via 67, lateral conductive layer 68, and conductive via 69. From inner bond ball 62, the conductive path extends to terminal 87 through conductive via 75, lateral conductive layer 79, and conductive via 77. In one example, integrated circuit 13 communicates with integrated circuit 33 using Serial Peripheral Interface (SPI), and conductive path 122 represents one of the data lines (for instance, the SDI line). Another conductive path, illustrated by heavy line 123, represents the other data line (for instance, the SDO line). Two control lines CS and SCLK are connected in similar fashion, which are not shown in the particular cross-section of FIG. 8. As illustrated from the above example, the standard SPI BUS interface is secure and is protected from tampering because the conductive paths are established between integrated circuit 13 of BGA security cap 11 and integrated circuit 33 of BGA package portion 31 through a subset of inner bond balls of BGA security cap 11.

In the present example, BGA security cap 11 is a security cap that is packaged together with another BGA package 31 to form a POP secure module. Integrated circuit die 13 of BGA security cap 11 is a specialized IC that is designed for security purpose only. It is made inexpensive because it does not include any additional circuitry or devices other than that for the purpose of detecting tamper conditions and erasing the secure data. On the other hand, integrated circuit die 33 of BGA package 31 is a general purpose IC that does not have a security protection capability. In one example, integrated circuit die 33 includes a mass produced SDRAM that is manufactured by an entity other than the entity that sells integrated circuit die 13. If a tamper condition is detected, then the contents of the SDRAM are erased. For instance, the SDRAM component sees many uses including the use in a Point of Sale (POS) terminal and consequently it is produced in high volumes at relatively low cost. Therefore, by using a low cost security cap to form a secure module with a general-purpose mass produced IC, the overall cost of the secure module is reduced.

Figure 9:
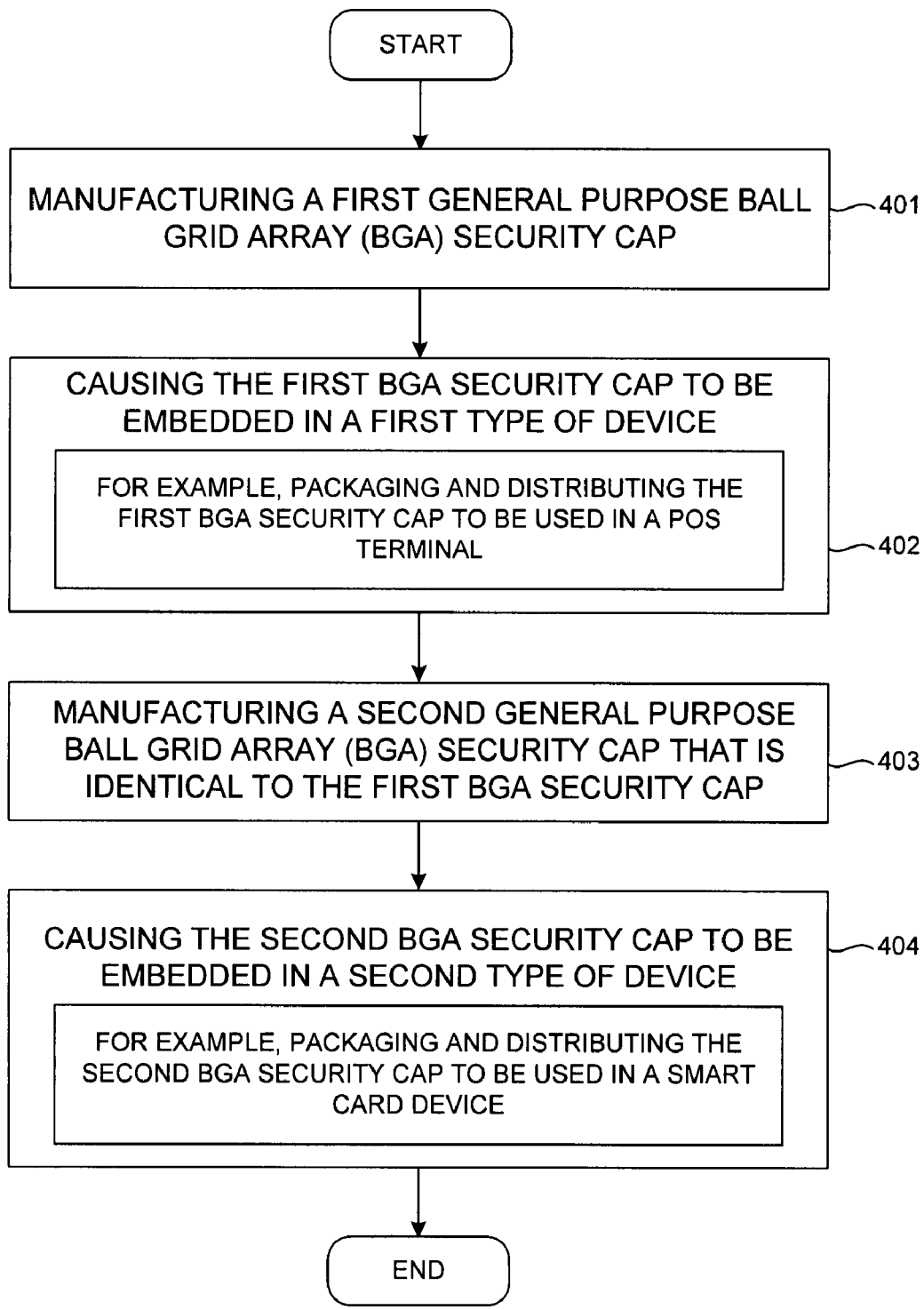
FIG. 9 is a flow chart of a method of manufacturing and distributing a general-purpose BGA security cap in accordance with a novel aspect.

FIG. 9 is a flow chart of a method of manufacturing and distributing a general-purpose BGA security cap in accordance with a novel aspect. In step 401, a first entity (for example, a first semiconductor company) manufactures a first BGA security cap. In step 402, the first entity makes certain effort such that the first BGA security cap is embodied in a first type of device. For example, the first entity makes an agreement with a second entity (for example, a distributor of integrated circuits) to package and distribute the first BGA security cap to be purchased by a third entity (for example, a user who builds the first security cap into a POS terminal device). In step 403, the first entity manufacturers a second BGA security cap that is identical to the first BGA security cap. In step 404, the first entity again makes certain effort such that the second BGA security cap is embodied in a second type of device. For example, the first entity makes another agreement with the second entity to package and distribute the second BGA security cap to be purchased by the third entity (for example, a different user who builds the second security cap into a type of device other than a point of sale terminal). As illustrated in FIG. 9, even though the integrated circuit of the BGA security cap is a specialized security IC, the BGA security cap is a "general purpose" security cap because it is usable to provide anti-tamper security to numerous different types of underlying circuits. The general-purpose BGA security cap is used in combination with other different types of BGA packages to form secure modules to be used for different types of devices. The general purpose BGA security cap therefore provides a more flexible and less expensive security solution.

Figure 10:
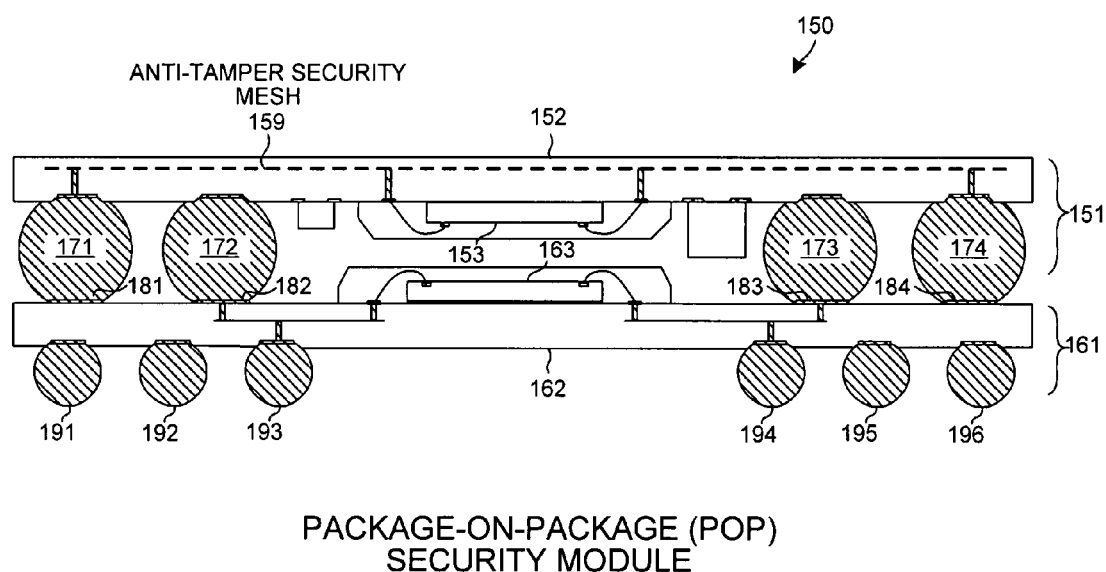
FIG. 10 is a simplified cross-sectional view of a package-on-package (POP) secure module 150 that includes a BGA security cap.

FIG. 10 is a simplified cross-sectional view of another package-on-package (POP) secure module 150. POP secure module 150 includes BGA security cap 151 and a BGA package portion 161. BGA security cap 151 includes a substrate member 152, an integrated circuit die 153, and an array of bond balls. Four of the bond balls 171-174 are illustrated in the cross-sectional view. Integrated circuit die 153 is connected by wire bonds to a lower surface of substrate member 152. Bond balls 171-174 are also disposed to the lower surface of substrate member 152. An anti-tamper security mesh 159 is embedded in substrate member 152. BGA package portion 161 includes a substrate member 162, an integrated circuit die 163, an array of lands, and an array of bond balls. Four of the lands 181-184 and six of the bond balls 191-196 are illustrated in the cross-sectional view. Integrated circuit die 163 is connected by wire bonds to an upper surface of substrate member 162. Bond balls 191-196 are disposed to a lower surface of substrate member 162. Bond balls 171-174 of BGA security cap 151 register with and are fixed to corresponding ones of the lands 181-184 on the upper surface of substrate member 162 of BGA package portion 161. BGA security cap 151 is therefore piggy-back mounted to BGA package portion 161 so that BGA security cap 151 and BGA package portion 161 together form POP secure module 150. Security module 150 is similar to security module 10 of FIG. 2. The only difference is that integrated circuit 163 is fixed to the upper surface of substrate member 162. Therefore, in the example of FIG. 10, the bond balls of BGA security cap 151 are of a larger size to provide clearance.

Figure 11:
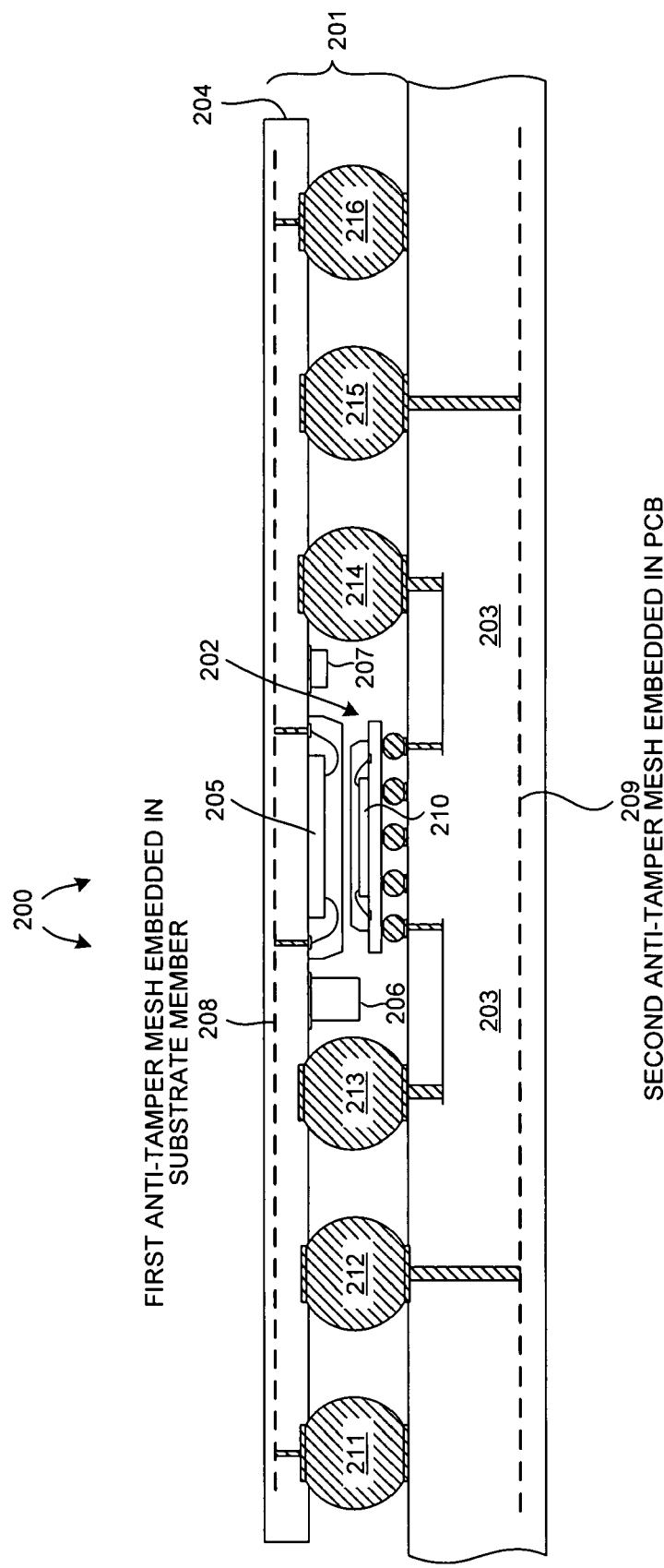
FIG. 11 is a simplified cross-sectional view of a BGA security cap that is used in accordance with a novel aspect.

FIG. 11 is a simplified cross-sectional view of a secure module 200 in accordance with another novel aspect. Secure module 200 includes a BGA security cap 201, a BGA package 202, and a printed circuit board 203. BGA security cap 201 includes a substrate member 204, an integrated circuit die 205, an array of bond balls, and discrete components 206 and 207. Six of the bond balls 211-216 are illustrated in the cross-sectional view. The bond balls are fixed to the bottom surface of substrate member 204. Integrated circuit die 205 is connected by bond wires to the bottom surface of substrate member 204. As illustrated in FIG. 11, BGA security cap 201 is surface mounted to printed circuit board 203. BGA package 202 is also surface mounted to printed circuit board 203 such that it is physically covered by substrate member 204 from the top, by bond balls 211-216 from the side, and by printed circuit board 203 from the bottom.

As illustrated in FIG. 11, a first anti-tamper security mesh 208 of conductors is embedded in substrate member 204 and a second anti-tamper security mesh layer 209 is embedded in printed circuit board 203. Integrated circuit die 205 drives and monitors the first mesh 208 and the second mesh 209 through conductive paths. As described earlier, tamper control logic located on integrated circuit die 205 detects various tamper conditions and informs integrated circuit 210 through a dedicated tamper detection line. Integrated circuit 205 also communicates a tamper detection result with integrated circuit 210 through a serial interface, such as a SPI or JTAG interface. In the example of FIG. 11, BGA package 202 is of a much smaller size as compare to BGA security cap 201, and is located underneath substrate member 204. The bond balls of BGA security cap 201 are of a much larger size to accommodate the presence of BGA package 202.

Figure 12:
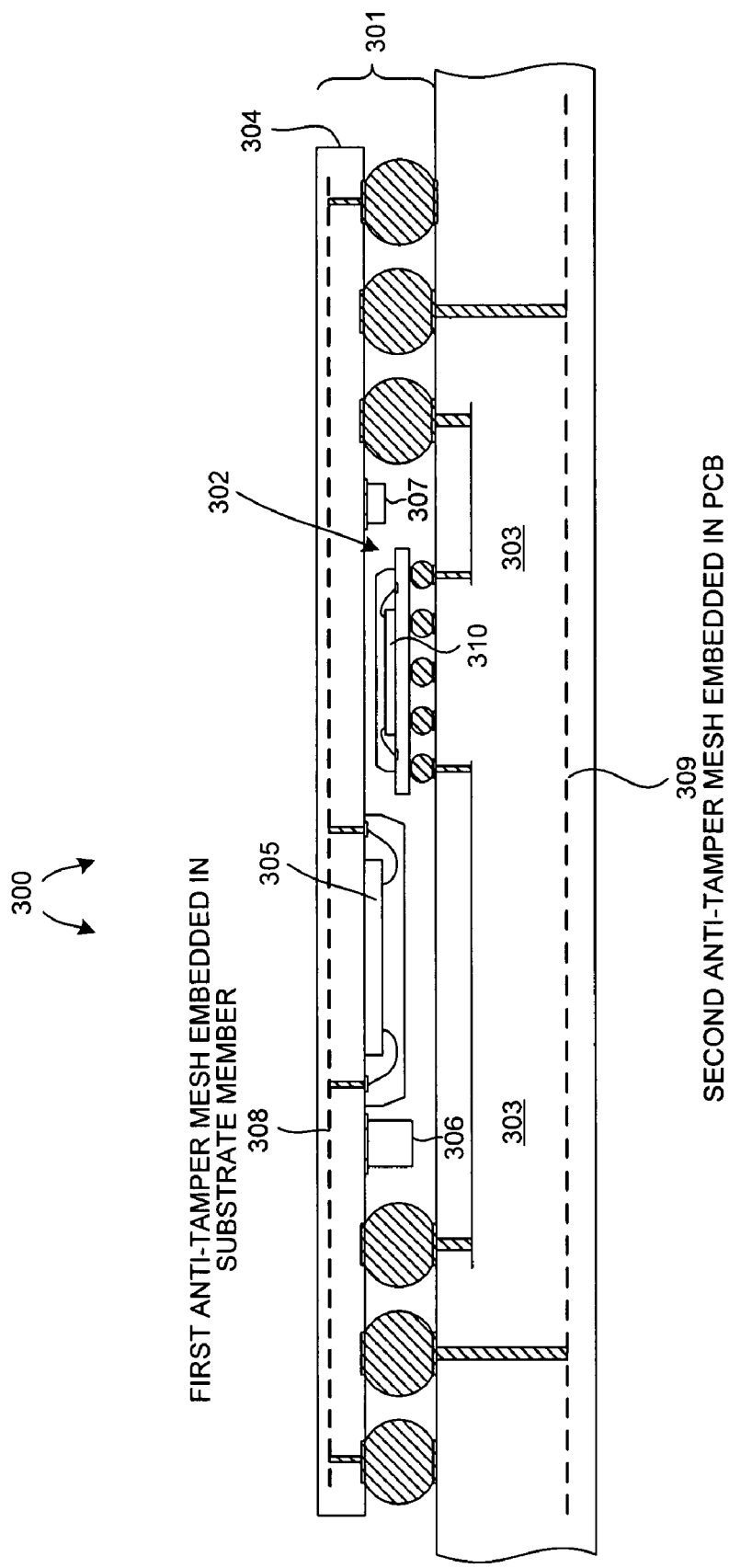
FIG. 12 is a simplified cross-sectional view of a BGA security cap that is used in accordance with another novel aspect.

FIG. 12 is a simplified cross-sectional view of a secure module 300 in accordance with another novel aspect. Secure module 300 includes a BGA security cap 301, a BGA package 302, and a printed circuit board 303. BGA security cap 301 includes a substrate member 304, an integrated circuit die 305, an array of bond balls, and discrete components 306 and 307. Similar to FIG. 11, both BGA security cap 301 and BGA package 302 are surface mounted to printed circuit board 303 such that BGA package 302 is covered by substrate member 304 from the top, by bond balls of BGA security cap 301 from the side, and by printed circuit board 303 from the bottom. Also similar to FIG. 11, integrated circuit die 305 drives and monitors a first mesh 308 embedded in substrate member 304 and a second mesh 309 embedded in printed circuit board 303 through conductive paths. Tamper control logic located on integrated circuit die 305 detects various tamper conditions and informs integrated circuit 310 through a dedicated tamper detection line. Integrated circuit 305 also communicates a tamper detection result with integrated circuit 310 through a serial physical interface. However, in the example of FIG. 12, BGA package 302 is not located underneath integrated circuit die 305. Instead, BGA package 302 and integrated circuit die 305 are located side-by-side. As a result, the size of bond balls of BGA security cap 301 is smaller as compared to the size of bond balls of BGA security cap 201 of FIG. 11.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
   a substrate member having an anti-tamper security mesh of conductors;
   an integrated circuit die that is fixed to a first side of the substrate member, wherein a conductor of the anti-tamper security mesh is coupled to the integrated circuit die; and
   an array of bond balls including a plurality of outer bond balls and a plurality of inner bond balls, wherein the bond balls are disposed on the first side of the substrate member, and wherein the integrated circuit communicates tamper detection data using a serial physical interface through a subset of the inner bond balls.

2. The apparatus of claim 1, wherein the serial physical interface is a SPI interface.

3. The apparatus of claim 2, wherein the serial physical interface is a JTAG interface.

4. The apparatus of claim 1, wherein the tamper detection data is a signal that identifies a tamper condition.

5. The apparatus of claim 1, wherein the tamper detection data is tamper log information, and wherein the tamper log information is transferred out of the integrated circuit and through the subset of inner bonds balls.

6. The apparatus of claim 1, wherein a second conductor of the anti-tamper security mesh is electrically coupled to one of the outer bond balls.

7. An apparatus comprising:
   a substrate member having an anti-tamper security mesh of conductors;
   an integrated circuit die that is fixed to a first side of the substrate member, wherein a conductor of the anti-tamper security mesh is coupled to the integrated circuit die;
   an array of bond balls including a plurality of outer bond balls and a plurality of inner bond balls, wherein the bond balls are disposed on the first side of the substrate member, and wherein the integrated circuit communicates tamper detection data using a serial physical interface through a subset of the inner bond balls;
   a first discrete resistor that is fixed to the first side of the substrate member, wherein a first terminal of the first discrete resistor is coupled to a first bond ball, and wherein a second terminal of the first discrete resistor is coupled to a voltage source; and
   a second discrete resistor that is fixed to the first side of the substrate member, wherein a first terminal of the second discrete resistor is coupled to a second bond ball, and wherein a second terminal of the second discrete resistor is coupled to ground.

8. The apparatus of claim 1, wherein only one integrated circuit die is fixed to the substrate member.

9. The apparatus of claim 1, further comprising:
   a BGA package having a second substrate member, a second integrated circuit die and an array of second bond balls, wherein the second integrated circuit die and the array of second bond balls are disposed on a first side of the second substrate member, wherein an array of lands is disposed on a second side of the second substrate member opposite the first side, and wherein the bond balls are fixed to corresponding ones of the lands.

10. The apparatus of claim 9, further comprising:
    a printed circuit board having an anti-tamper security mesh layer, wherein the BGA package is surface mounted to the printed circuit board, and wherein a conductor of the anti-tamper security mesh layer is electrically coupled to the integrated circuit die.

11. The apparatus of claim 10, wherein the integrated circuit monitors the anti-tamper security mesh layer and communicates to the second integrated circuit using the serial physical interface.

12. The apparatus of claim 1, further comprising:
    a Ball Grid Array (BGA) package; and
    a printed circuit board, wherein the bond balls are surface mounted to a first side of the printed circuit board, and wherein the BGA package is surface mounted to the first side of the printed circuit board such that the BGA package is enclosed by the substrate member, the inner bond balls, and the printed circuit board.

13. The apparatus of claim 12, wherein the printed circuit board comprises an anti-tamper security mesh layer, and wherein a conductor of the anti-tamper security mesh layer is electrically coupled to the integrated circuit die.

14. An apparatus, comprising:
    a substrate member having an anti-tamper security mesh of conductors;
    a plurality of outer bond balls attached to the substrate member; and
    means for monitoring the anti-tamper security mesh to obtain tamper detection data, wherein the means is also for communicating the tamper detection data from the means using a serial physical interface, and wherein the communicating occurs through bond balls other than the plurality of outer bond balls.

15. The apparatus of claim 14, wherein the means is an integrated circuit die and a second plurality of bond balls, wherein the integrated circuit die and the second plurality of bond balls are attached to the substrate member, wherein a conductor of the anti-tamper security mesh is coupled to the integrated circuit die, and wherein the integrated circuit communicates the tamper detection data through the second plurality of bond balls.

16. An apparatus comprising:
a substrate member having an anti-tamper security mesh of conductors;
an integrated circuit die that is fixed to a first side of the substrate member, wherein a conductor of the anti-tamper security mesh is coupled to the integrated circuit die; and
an array of bond balls including a plurality of outer bond balls and a plurality of inner bond balls, wherein the bond balls are disposed on the first side of the substrate member, wherein the integrated circuit communicates configuration information using a serial physical interface through a subset of the inner bond balls, and wherein the configuration information sets a voltage level used in identifying a power tamper condition.

17. The apparatus of claim 16, further comprising:
a Ball Grid Array (BGA) package; and
a printed circuit board, wherein the bond balls are surface mounted to a first side of the printed circuit board, and wherein the BGA package is surface mounted to the first side of the printed circuit board such that the BGA package is enclosed by the substrate member, the inner bond balls, and the printed circuit board.

18. The apparatus of claim 17, wherein the printed circuit board comprises an anti-tamper security mesh layer, and wherein a conductor of the anti-tamper security mesh layer is electrically coupled to the integrated circuit die.

19. An apparatus comprising:
a substrate member having an anti-tamper security mesh of conductors;
an integrated circuit die that is fixed to a first side of the substrate member, wherein a conductor of the anti-tamper security mesh is coupled to the integrated circuit die;
an array of bond balls including a plurality of outer bond balls and a plurality of inner bond balls, wherein the bond balls are disposed on the first side of the substrate member, wherein the integrated circuit communicates configuration information using a serial physical interface through a subset of the inner bond balls, and wherein the configuration information sets a voltage level used in identifying a power tamper condition;
a first discrete resistor that is fixed to the first side of the substrate member, wherein a first terminal of the first discrete resistor is coupled to a first bond ball, and wherein a second terminal of the first discrete resistor is coupled to a voltage source; and
a second discrete resistor that is fixed to the first side of the substrate member, wherein a first terminal of the second discrete resistor is coupled to a second bond ball, and wherein a second terminal of the second discrete resistor is coupled to ground.

20. The apparatus of claim 16, wherein a second conductor of the anti-tamper security mesh is electrically coupled to one of the outer bond balls.

21. The apparatus of claim 16, wherein the serial physical interface is a SPI interface.

* * * * *